(12) United States Patent
Zhao et al.

(10) Patent No.: US 12,295,216 B2
(45) Date of Patent: May 6, 2025

(54) DISPLAY SUBSTRATE AND MANUFACTURING METHOD THEREFOR, AND DISPLAY APPARATUS

(71) Applicant: BOE TECHNOLOGY GROUP CO., LTD., Beijing (CN)

(72) Inventors: Jia Zhao, Beijing (CN); Pinfan Wang, Beijing (CN); Fangxu Cao, Beijing (CN); Zunqing Song, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 102 days.

(21) Appl. No.: 17/769,030

(22) PCT Filed: May 17, 2021

(86) PCT No.: PCT/CN2021/094201
§ 371 (c)(1),
(2) Date: Apr. 14, 2022

(87) PCT Pub. No.: WO2021/238712
PCT Pub. Date: Dec. 2, 2021

(65) Prior Publication Data
US 2024/0107824 A1    Mar. 28, 2024

(30) Foreign Application Priority Data
May 29, 2020    (CN) .......................... 202010476101.1

(51) Int. Cl.
*H10K 59/124*    (2023.01)
*H10K 59/12*    (2023.01)
*H10K 102/00*    (2023.01)

(52) U.S. Cl.
CPC ....... *H10K 59/124* (2023.02); *H10K 59/1201* (2023.02); *H10K 2102/311* (2023.02)

(58) Field of Classification Search
CPC ............. H10K 59/124; H10K 59/1201; H10K 2102/311; H10K 71/80; H10K 77/111;
(Continued)

(56) References Cited

U.S. PATENT DOCUMENTS 9,536,860 B2    1/2017   Hyoyul et al.
11,341,921 B2*   5/2022   Shin ..................... H10K 59/131
(Continued)

FOREIGN PATENT DOCUMENTS

CN    103424913 A    12/2013
CN    109599402 A    4/2019
(Continued)

OTHER PUBLICATIONS

Written Opinion from PCT/CN2021/094201 dated Aug. 16, 2021.
(Continued)

*Primary Examiner* — Kevin Quarterman
(74) *Attorney, Agent, or Firm* — Calfee, Halter & Griswold LLP (57) ABSTRACT

A display substrate has a central region and an edge region, and includes a plurality of structural units arranged in an array in the central region and the edge region; each structural unit is provided with a plurality of through holes, and divided by the plurality of through holes into a pixel island for displaying and a bridge portion for transmitting signals; the plurality of through holes are arranged around the pixel island; a part of the bridge portion is positioned between the pixel island and the through holes, and another part of the bridge portion is positioned between adjacent through holes; and a pixel pitch between adjacent pixel islands in the structural units in the edge region is equal to a pixel pitch between adjacent pixel islands in the structural units in the central region.

19 Claims, 8 Drawing Sheets

(58) Field of Classification Search
CPC .... H10K 59/122; H10K 59/131; H10K 59/35; H10K 59/12; G09F 9/301; G09F 9/33
See application file for complete search history.

(56) References Cited

U.S. PATENT DOCUMENTS

| | | | | |
|---|---|---|---|---|
| 11,469,285 | B2* | 10/2022 | Zhang | H10K 50/844 |
| 2008/0218369 | A1* | 9/2008 | Krans | A47G 11/003 |
| | | | | 313/511 |
| 2010/0330338 | A1* | 12/2010 | Boyce | H01L 23/4985 |
| | | | | 428/156 |
| 2016/0104756 | A1* | 4/2016 | Lee | H10K 59/353 |
| | | | | 257/40 |
| 2016/0293571 | A1 | 10/2016 | Hyoyul et al. | |
| 2016/0320878 | A1* | 11/2016 | Hong | G06F 1/1652 |
| 2018/0052493 | A1* | 2/2018 | Hong | B32B 3/08 |
| 2018/0143441 | A1 | 5/2018 | Seo | |
| 2021/0013434 | A1 | 1/2021 | Fangxu et al. | |
| 2021/0043698 | A1 | 2/2021 | Wenjing et al. | |

FOREIGN PATENT DOCUMENTS

| | | |
|---|---|---|
| CN | 109830614 A | 5/2019 |
| CN | 109920803 A | 6/2019 |
| CN | 109935730 A | 6/2019 |
| CN | 110265423 A | 9/2019 |
| CN | 110299078 A | 10/2019 |
| CN | 110350014 A | 10/2019 |
| CN | 110428740 A | 11/2019 |
| CN | 110660931 A | 1/2020 |
| CN | 110854166 A | 2/2020 |
| CN | 111179754 A | 5/2020 |
| CN | 111584606 A | 8/2020 |
| WO | 2018075292 A1 | 4/2018 |
| WO | 2021008239 A1 | 1/2021 |

OTHER PUBLICATIONS

International Search Report from PCT/CN2021/094201 dated Aug. 16, 2021.
Office action from Chinese Application No. 202010476101.1 dated Aug. 11, 2022.

* cited by examiner

DISPLAY SUBSTRATE AND MANUFACTURING METHOD THEREFOR, AND DISPLAY APPARATUS

CROSS-REFERENCE TO RELATED APPLICATIONS

The present disclosure is the U.S. national phase application of PCT Application No. PCT/CN2021/094201, filed May 17, 2021, which claims priority of Chinese Patent Application No. 202010476101.1 entitled "DISPLAY SUBSTRATE, DISPLAY APPARATUS AND MANUFACTURING METHOD THEREOF", filed on May 29, 2020, the entire disclosures of both of which are incorporated herein by reference in its entirety.

TECHNICAL FIELD

The present disclosure relates to the field of display technology, and specifically, to a display substrate, a display apparatus and a manufacturing method thereof.

BACKGROUND

With the development of display technology, the organic light-emitting diode (referred to as OLED for short) capable of flexible displaying facilitates diversification of display and gradually becomes the mainstream of display technology. In some related technologies, the OLED flexible display apparatus can implement folding of a two-dimensional surface, but is not adapted for the flexible requirement of the display substrate of the display apparatus in more complicated circumstances (such as head mounted display and the like).

It should be noted that the above information disclosed in the BACKGROUND section is only used to enhance the understanding of the background of the present disclosure, and therefore may include the information that does not constitute the prior art known to those of ordinary skill in the art.

SUMMARY

The present disclosure is directed to overcome the above shortcomings in related art, and to provide a display substrate, a display apparatus and a manufacturing method thereof.

According to one aspect of the present disclosure, there is provided a display substrate, the display substrate has a central region and an edge region, and the display substrate includes a plurality of structural units arranged in an array in the central region and the edge region;
where each structural unit is provided with a plurality of through holes, and divided by the plurality of through holes into a pixel island for displaying and a bridge portion for transmitting signals; the plurality of through holes are arranged around the pixel island; a part of the bridge portion is positioned between the pixel island and the through holes, and another part of the bridge portion is positioned between adjacent through holes; and
where a pixel pitch between adjacent pixel islands in the structural units in the edge region is equal to a pixel pitch between adjacent pixel islands in the structural units in the central region, and both pixel pitches are equal to a first pixel pitch.

In some exemplary embodiments of the present disclosure, the through hole includes a first long-strip-shaped hole and second long-strip-shaped holes located at opposite ends of the first long-strip-shaped hole, and the first long-strip-shaped hole is communicated with the second long-strip-shaped holes; a length direction of the first long-strip-shaped hole intersects with a length direction of the second long-strip-shaped holes, and a center point of the first long-strip-shaped hole and center points of the second long-strip-shaped holes are on a same straight line; where a length of the first long-strip-shaped hole is greater than a length of the second long-strip-shaped hole.

In some exemplary embodiments of the present disclosure, a difference between the length of the first long-strip-shaped hole and the length of the second long-strip-shaped hole is 150 μm to 200 μm.

In some exemplary embodiments of the present disclosure, the length of the first long-strip-shaped hole is 400 μm to 1000 μm; and the length of the second long-strip-shaped hole is 220 μm to 820 μm.

In some exemplary embodiments of the present disclosure, widths of the first long-strip-shaped hole and the second long-strip-shaped holes are equal.

In some exemplary embodiments of the present disclosure, the widths of the first long-strip-shaped hole and the second long-strip-shaped holes are 5 μm to 50 μm.

In some exemplary embodiments of the present disclosure, the structure unit is provided with four pixel islands arranged in an array in a first direction and a second direction, and each pixel island is surrounded by the four through holes; where
the second direction is a length direction of the first long-strip-shaped holes of two through-holes that are opposite in the first direction, and the first direction is a length direction of the first long-strip-shaped holes of two through-holes that are opposite in the second direction, and the second long-strip-shaped hole of one of any two adjacent through holes is opposite to a middle part of the first long-strip-shaped hole of another one of the any two adjacent through holes.

In some exemplary embodiments of the present disclosure, the first pixel pitch is one half of a sum of the length of the first long-strip-shaped hole and the length of the second long-strip-shaped hole.

According to another aspect of the present disclosure, there is provided a manufacturing method of the display apparatus, which includes:
providing a base opened with a plurality of hole regions;
forming a display substrate on the base, where the display substrate is the display substrate according to any one of the embodiments as described above, and the through holes of the display substrate correspond to the hole regions of the base one by one;
separating the display substrate from the base;
attaching the separated display substrate on an arc-shaped backplane, causing the display substrate to have an arc-shaped display structure;
where when the display substrate has the arc-shaped display structure, a pixel pitch between adjacent pixel islands in the structural unit of the central region is equal to a second pixel pitch, and a pixel pitch between adjacent pixel islands in the structural unit of the edge region is equal to a third pixel pitch, and the third pixel pitch is greater than the first pixel pitch and smaller than the second pixel pitch.

In some exemplary embodiments of the present disclosure, a difference between the second pixel pitch and the first pixel pitch is 10 μm to 100 μm.

In some exemplary embodiments of the present disclosure, separating the display substrate from the base includes:
    separating the display substrate from the base by means of laser separation, chemical etching separation, physical mechanical separation or the like.

In some exemplary embodiments of the present disclosure, attaching the separated display substrate on the arc-shaped backplane includes:
    attaching the central region of the separated display substrate to a central region of the arc-shaped backplane; and
    rolling a roller from the central region of the display substrate to the edge region of the display substrate, causing the edge region of the display substrate to be attached with the central region of the arc-shaped backplane.

According to yet another aspect of the present disclosure, there is provided a display apparatus, which includes an arc-shaped backplane and an arc-shaped display structure attached on the arc-shaped backplane, and the arc-shaped display structure is formed by attaching the display substrate according to any one of the embodiments as described above with the arc-shaped backplane;
    where in the arc-shaped display structure, a pixel pitch between adjacent pixel islands in the structural unit of the central region is equal to a second pixel pitch, and a pixel pitch between adjacent pixel islands in the structural unit of the edge region is equal to a third pixel pitch, and the third pixel pitch is greater than the first pixel pitch and smaller than the second pixel pitch.

In some exemplary embodiments of the present disclosure, a difference between the second pixel pitch and the first pixel pitch is 10 μm to 100 μm.

In some exemplary embodiments of the present disclosure, the arc-shaped backplane includes an inner arc surface close to the arc-shaped display structure and an outer arc surface away from the arc-shaped display structure, the inner arc surface and the outer arc surface have a same shape, and the inner arc surface and the outer arc surface are in one of a circular arc type, an elliptic arc type, or a parabolic shape.

In some exemplary embodiments of the present disclosure, an angle between tangents corresponding to two ends of the outer arc surface in a bending direction is smaller than 180° and greater than or equal to 170°.

In some exemplary embodiments of the present disclosure, the display apparatus is a head-mounted display apparatus.

According to the display substrate, the display apparatus and its manufacturing method of the present disclosure, structural units with a plurality of through holes are provided in both the central region and edge region of the display substrate, thereby enabling the display substrate to have a certain stretchable function in whole, so as to be used in a head-mounted display apparatus. Furthermore, when this stretchable display substrate is attached on a backplane with a certain curvature, the stretching amounts are different in different regions during the stretching process because the display substrate of the present disclosure has specific structural units. Specifically, the stretching amount in the edge region is smaller than the stretching amount in the central region, so that the pixel pitch between adjacent pixel islands in the edge region is smaller than the pixel pitch between adjacent pixel islands in the central region. As the display substrate attached with the arc-shaped backplane has the characteristics of small pixel pitch in the edge region and large pixel pitch in the central region, such that the edge distortion phenomenon of the display apparatus that occurs during observation can be relieved.

It should be understood that both the foregoing general description and the following detailed description are exemplary and explanatory only without limiting the present disclosure.

BRIEF DESCRIPTION OF THE DRAWINGS

Accompanying drawings herein, which are incorporated in the specification and constitute a part of the present specification, illustrate embodiments conforming to the present disclosure, and are used to explain the principles of the present disclosure together with the specification. It is apparent that the accompanying drawings described below are only some embodiments of the present disclosure, and other accompanying drawings can also be obtained according to these accompanying drawings without any creative efforts by those skilled in the art.

REFERENCE NUMERALS 10. display apparatus; 11. display substrate; 11a. central region; 11b. edge region; 110. structural unit; 111.

through hole; 1111. first long-strip-shaped hole; 1112. second long-strip-shaped hole; 112. pixel island; 113. bridge portion; 1131. isolation structure; 12. arc-shaped backplane; 13. lens.

DETAILED DESCRIPTION

Exemplary embodiments will now be described more comprehensively with reference to the accompanying drawings. However, the exemplary embodiments can be implemented in various forms, and should not be construed as being limited to the examples set forth herein; on the contrary, these embodiments are provided to make the present disclosure be more comprehensive and complete, and the concepts of the exemplary embodiments will be comprehensively communicated to those skilled in the art. The same reference numerals in the accompanying drawings denote the same or similar structures, and thus detailed description thereof will be omitted. Furthermore, the accompanying drawings are merely schematic illustrations of the present disclosure and are not necessarily drawn to scale.

It should be noted that expressions "on . . . ", "formed on . . . ", and "disposed on . . . " herein may indicate that one layer is directly formed or disposed on another layer, or may indicate that one layer is indirectly formed or disposed on another layer, that is, there is(are) other layer(s) between the two layers.

Terms "one", "a/an", "the", "said" and "at least one" are used to denote the presence of one or a plurality of elements/components/etc.; terms "including" and "having" are used to denote the meaning of non-exclusive inclusion and refer to that there may be other elements/components/etc. in addition to the listed elements/components/etc.

It should be noted that terms "first", "second" etc. here may be used to describe various components, members, elements, regions, layers and/or portions, however, these components, members, elements, regions, layers and/or portions should not be limited by these terms. Instead, these terms are used to distinguish one of these components, members, elements, regions, layers and/or portions from another.

Figure 1:
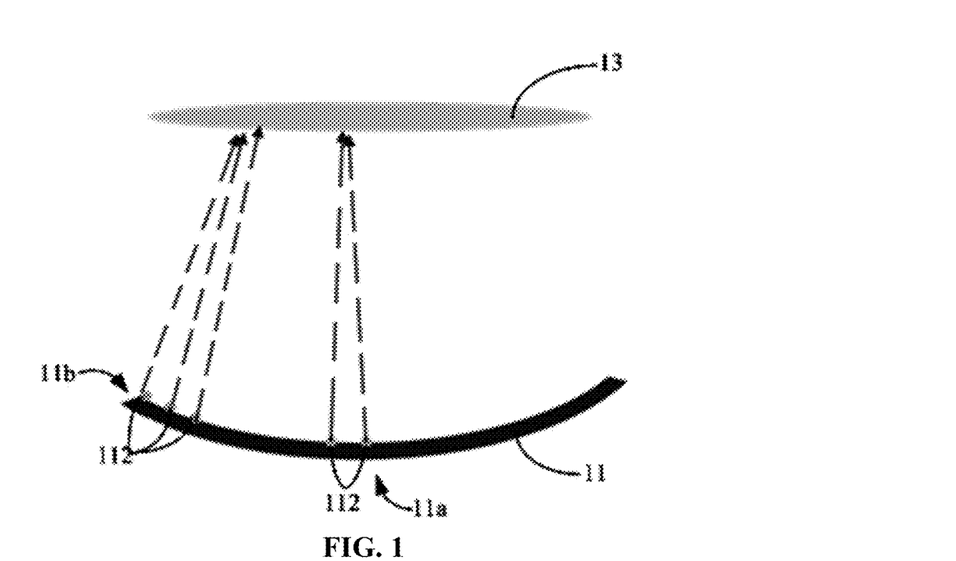
FIG. 1 is a diagram of the optical path between the display substrate and the lens described in the related art.

FIG. 1 illustrates is a diagram of the optical path between a display substrate 11 and a lens 13 described in the related art. In the related art, the display substrate 11 applied in the head-mounted display apparatus is arc-shaped, and the pixel pitch between adjacent pixel islands 112 in the edge region 11b of the display substrate 11 is the same as the pixel pitch between adjacent pixel islands 112 in the central region 11a, so that the edge distortion phenomenon is serious during observation. It should be noted that the dashed arrows in FIG. 1 indicate the optical paths.

Figure 2:
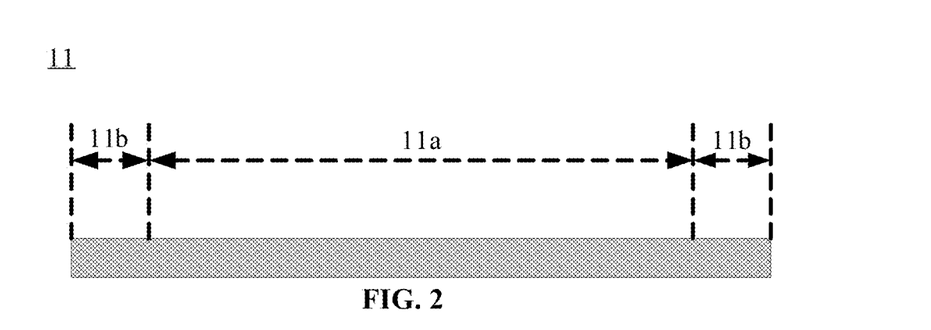
FIG. 2 is a schematic structural side view of the display substrate according to some embodiments of the present disclosure in an unstretched state.
Figure 3:
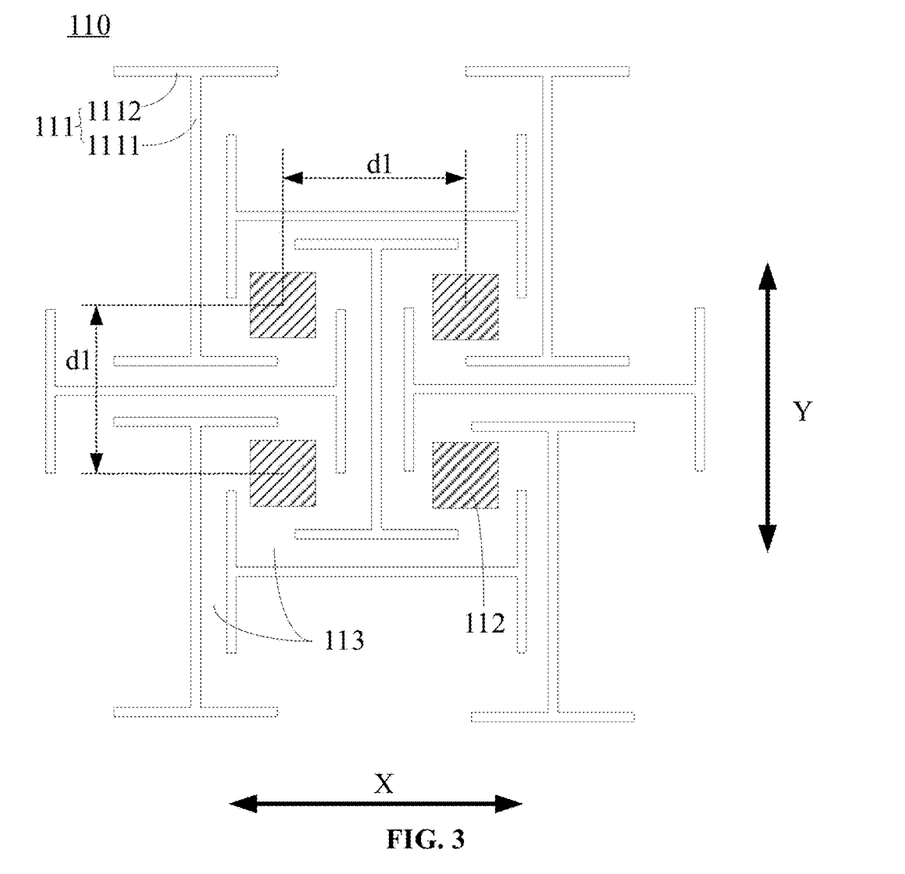
FIG. 3 is a schematic diagram illustrating the positions of various parts in the structural unit of the edge region or the central region in the display substrate according to some embodiments shown in FIG. 2.
Figure 4:
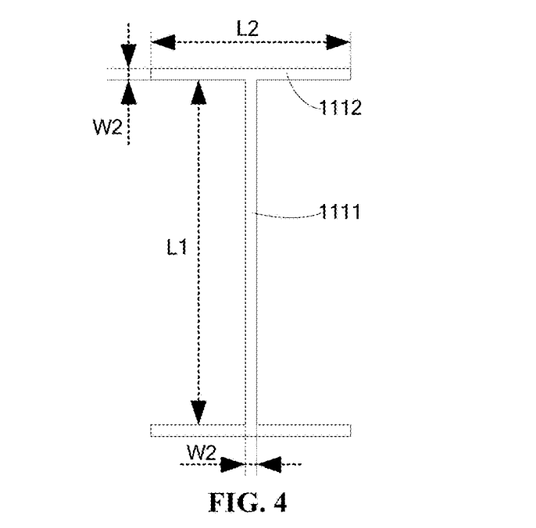
FIG. 4 is a schematic structural diagram of the through holes in the display substrate according to some embodiments shown in FIG. 3.
Figure 5:
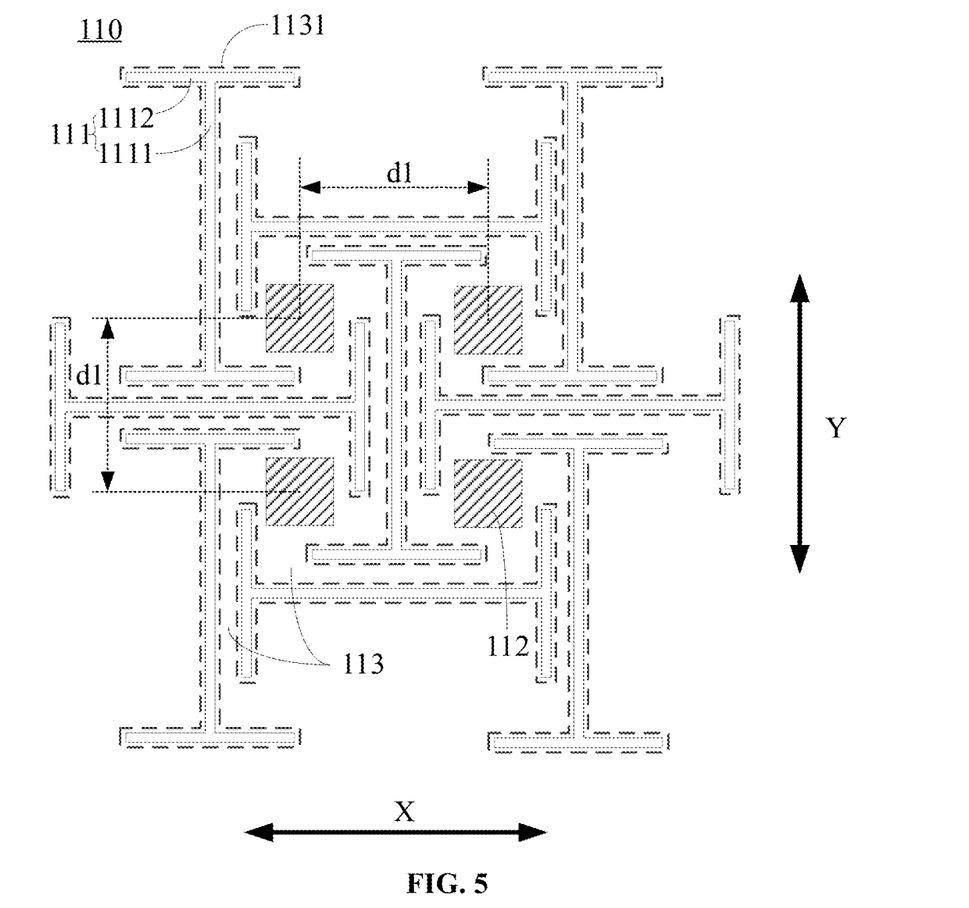
FIG. 5 is a schematic diagram illustrating the positions of various parts in the structural unit of the edge region or the central region in the display substrate according to some other embodiments shown in FIG. 2.

To this end, some embodiments of the present disclosure provide a display substrate 11. As shown in FIG. 2, the display substrate 11 has a central region 11a and an edge region 11b. As shown in FIG. 3 to FIG. 5, the display substrate 11 includes a plurality of structural units 110 arranged in an array in the central region 11a and the edge region 11b. As shown in FIG. 3 and FIG. 4, each structural unit 110 is provided with a plurality of through holes 111. It should be understood that the through holes 111 penetrate the entire display substrate 11 in the thickness direction of the display substrate 11. The structural unit 110 is divided by the plurality of through holes 111 into pixel islands 112 for display and bridge portions 113 for signal transmission. The bridge portion 113 includes a plurality of signal traces for transmitting signals. Each pixel island 112 may include a plurality of pixels, such as red (R) pixel, green (G) pixel, blue (B) pixel and the like. Each pixel may include a display unit, which may be an OLED display unit, and the display unit may be electrically connected with the signal traces for light emitting display.

As shown in FIG. 3 and FIG. 4, the plurality of through holes 111 are disposed around the pixel island 112 in each structural unit 110. A part of the bridge portion 113 is located between the pixel island 112 and the through hole 111, and another part thereof is located between adjacent through holes 111. It should be understood that the pixel pitch of adjacent pixel islands 112 in the structural units 110 of the edge region 11b in the display substrate 11 is equal to the pixel pitch of adjacent pixel islands 112 in the structural units 110 of the central region 11a, and both are equal to a first pixel pitch d1.

Figure 7:
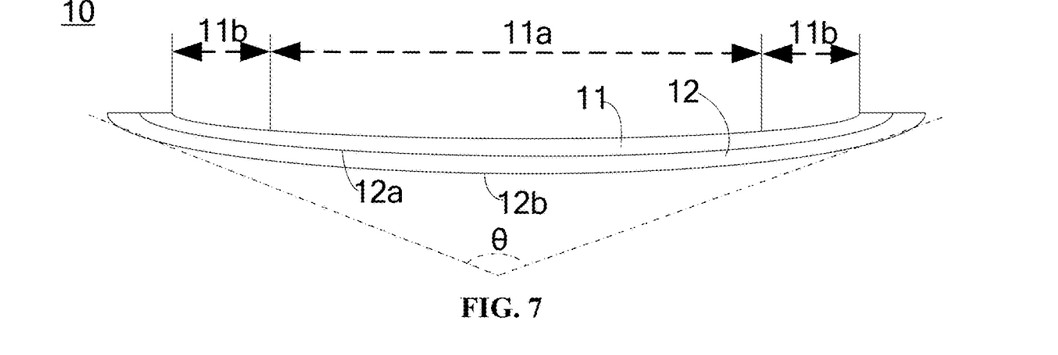
FIG. 7 is a schematic structural side view of the display apparatus according to some embodiments of the present disclosure.
Figure 11:
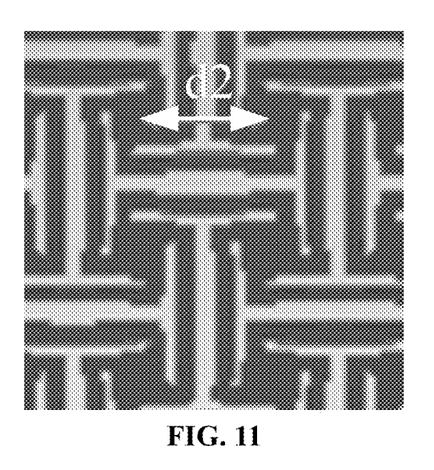
FIG. 11 is an enlarged simulation effect diagram of region A in the central region of the display substrate in an arc shape shown in FIG. 10.
Figure 12:
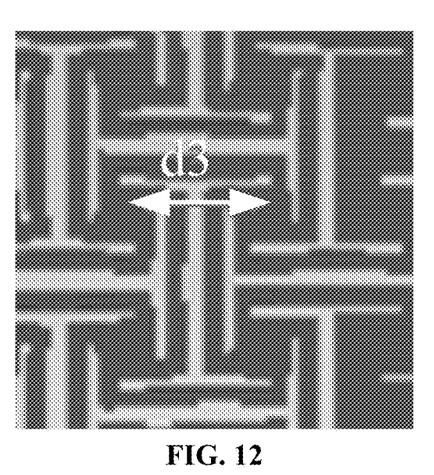
FIG. 12 is an enlarged simulation effect diagram of region B in the edge region of the display substrate in an arc shape shown in FIG. 10.
Figure 13:
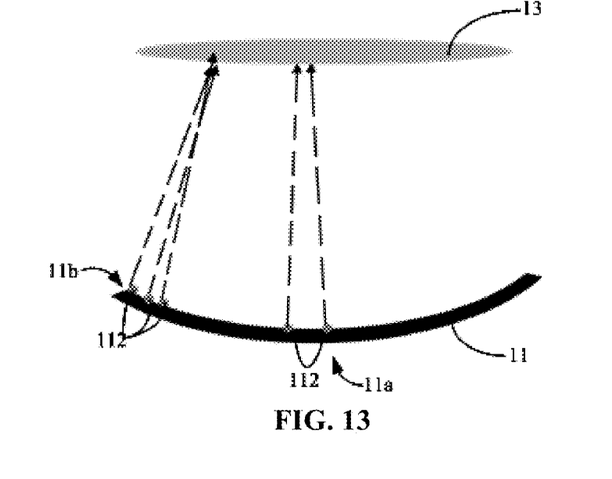
FIG. 13 is a diagram of the optical path between the display substrate in an arc shape and the lens according to some embodiments of the present disclosure.

In some embodiments of the present disclosure, by providing structural units 110 with the plurality of through holes 111 in both the central regions 11a and the edge regions 11b of the display substrate 11, the display substrate 11 as a whole has a certain stretchability, and can be used in a head-mounted display apparatus. Furthermore, as shown in FIG. 7, when this stretchable display substrate 11 is attached on a backplane 12 with a certain curvature, the stretching amounts are different in different regions during the stretching process because the display substrate 11 of the present disclosure has specific structural units 110 as shown in FIG. 3 to FIG. 5. Specifically, the stretching amount in the edge region 11b is smaller than the stretching amount in the central region 11a, as shown in FIG. 8 to FIG. 12, so that the pixel pitch d3 of adjacent pixel islands 112 in the edge region 11b is smaller than the pixel pitch d2 of adjacent pixel islands 112 in the central region 11a. As the display substrate 11 attached with the arc-shaped backplane 12 (i.e., the display substrate 11 with an arc-shaped display structure) has the characteristics that the pixel pitch d3 in the edge region 11b is small, and the pixel pitch d2 in the central region 11a is large, when compared with the solutions mentioned in the related art, the edge distortion phenomenon of the display apparatus 10 that occurs during observation can be relieved. FIG. 13 illustrates a diagram of the optical path between the display substrate 11 in an arc shape and the lens 13 according to some embodiments of the present disclosure. It should be noted that the optical path is represented by a dotted arrow in FIG. 13.

Furthermore, it should also be noted that a pixel is the smallest unit that constitutes a digital image, i.e. a color point of one color; the pixel pitch refers to the distance between the corresponding pixel points in adjacent pixel islands in the display substrate. For example, each pixel island includes red pixel, green pixel, and blue pixel arranged horizontally, and the pixel pitch refers to a horizontal distance between the red pixels (or green pixels, or blue pixels) in two adjacent pixel islands. Furthermore, it should be understood that since the pixels are actually square, the pixel islands including horizontally arranged red, green, and blue pixels may also be square, but the shape of the pixel islands is not limited thereto, and may also be hexagonal and the like, depending on the number and arrangement of the pixels in the pixel islands.

The specific structural unit 110 in the display substrate 11 according to some embodiments of the present disclosure will be described in detail below with reference to the accompanying drawings.

In some embodiments, as shown in FIG. 3 and FIG. 4, the through hole 111 in the structure unit 110 has a first long-strip-shaped hole 1111 and second long-strip-shaped holes 1112 located at opposite ends of the first long-stripshaped hole 1111, and the first long-strip-shaped hole 1111 is communicated with the second long-strip-shaped holes 1112 and corresponds to a middle region of the second long-strip-shaped holes 1112. In other words, the length direction of the first long-strip-shaped hole 1111 intersects with the length direction of the second long-strip-shaped holes 1112, and the center point of the first long-strip-shaped hole 1111 and the center points of the second long-strip-shaped holes 1112 are on the same straight line. As shown in FIG. 4, the through hole 111 may be formed in an "H" structure.

As shown in FIG. 4, in the through hole 111, a length L1 of the first long-strip-shaped hole 1111 is greater than a length L2 of the second long-strip-shaped hole 1112. Optionally, the difference between the length L1 of the first long-strip-shaped hole 1111 and the length L2 of the second long-strip-shaped hole 1112 is about 150 μm to 200 μm, such as: 150 μm, 160 μm, 170 μm, 180 μm, 190 μm, 200 μm, and the like.

Specifically, the length L1 of the first long-strip-shaped hole 1111 is about 400 μm to 1000 μm; such as: 400 μm, 600 μm, 800 μm, 1000 μm, and the like. The length L2 of the second long-strip-shaped hole 1112 is about 220 μm to 820 μm; such as: 220 μm, 420 μm, 620 μm, 820 μm, and the like.

In some embodiments, in the through hole 111, a width W1 of the first long-strip-shaped hole 1111 and a width W2 of the second long-strip-shaped hole 1112 are equal. Optionally, the width W1 of the first long-strip-shaped hole 1111 and the width W2 of the second long-strip-shaped hole 1112 are about 5 μm to 50 μm, such as: 5 μm, 14 μm, 23 μm, 32 μm, 41 μm, 50 μm, and the like.

In some embodiments, as shown in FIG. 3, each structural unit 110 may be provided with four pixel islands 112 arranged in an array in a first direction X and a second direction Y, and each pixel island 112 is surrounded by four through holes 111. The through hole 111 is formed as the "H" structure mentioned in the previous embodiments. The second direction Y is the length direction of the first long-strip-shaped holes 1111 of two through holes 111 that are opposite in the first direction X (that is, the through holes 111 located at two opposite sides of the pixel island 112 in the first direction X). The first direction X is the length direction of the first long-strip-shaped hole 1111 of two through-holes 111 that are opposite in the second direction Y (that is, the through holes 111 located at two opposite sides of the pixel island 112 in the second direction Y). The second long-strip-shaped hole 1112 of one of any two adjacent through holes 111 around each pixel island 112 is opposite to the middle region of the first long-strip-shaped hole 1111 of another one of the any two adjacent through holes.

Figure 6:
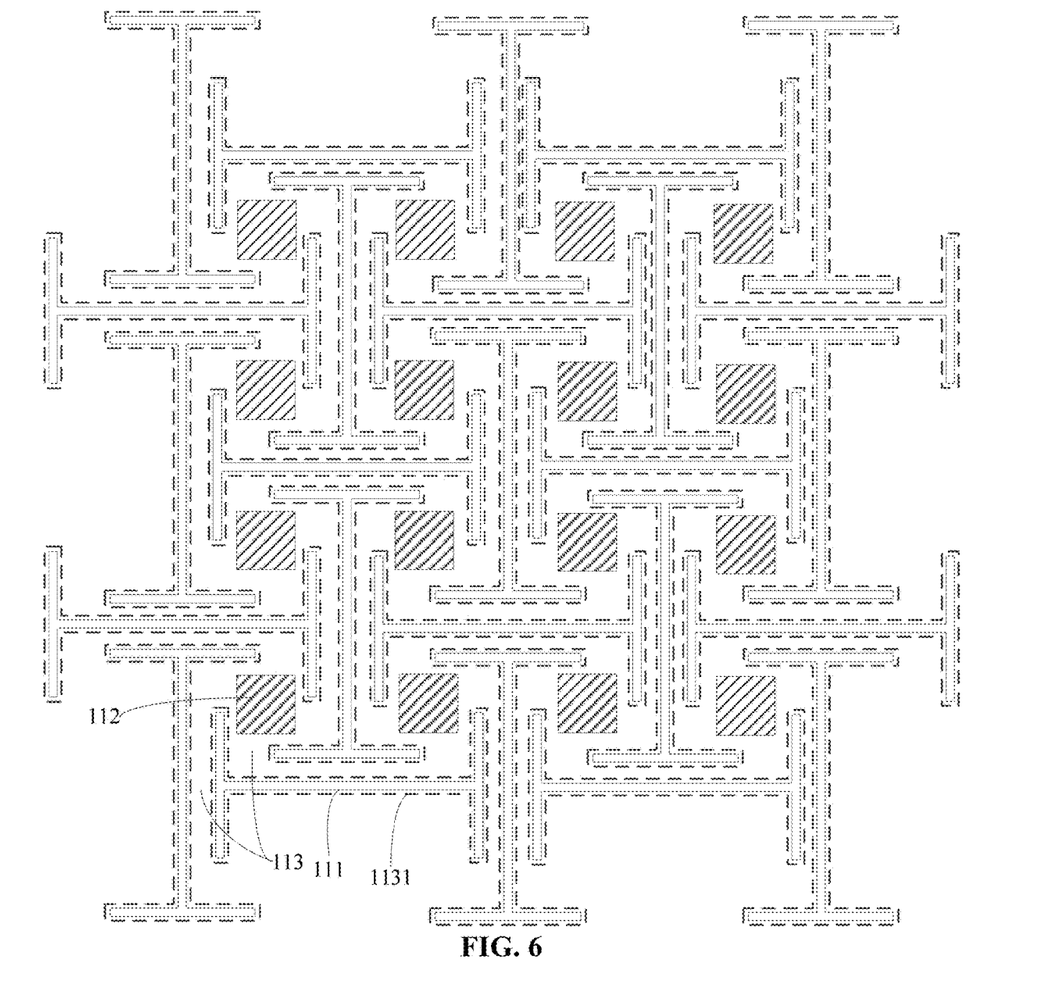
FIG. 6 is a schematic diagram of the positions of the four structural units shown in FIG. 5.

It should be understood that, as shown in FIG. 3, FIG. 5 and FIG. 6, adjacent pixel islands 112 in each structural unit 110 may share part of the through-holes 111, as shown in FIG. 6, and adjacent structural units 110 may also share part of the through-holes 111.

In some embodiments, in the structural unit 110, the first pixel pitch d1 of the adjacent pixel islands 112 is one half of the sum of the length L1 of the first long-strip-shaped hole 1111 and the length L2 of the second long-strip-shaped hole 1112.

Based on the design of the above specific structural unit 110, the display substrate 11 according to some embodiments of the present disclosure may be stretched to a certain extent in the process of being attached with the arc-shaped backplane 12, and the stretching amounts are different in different regions of the display substrate 11. Specifically, the stretching amount in the edge region 11b is smaller than the stretching amount in the central region 11a, so that the pixel pitch d3 of the adjacent pixel islands 112 in the edge region 11b is smaller than the pixel pitch d2 of the adjacent pixel islands 112 in the central region 11a. As the display substrate 11 attached with the arc-shaped backplane 12 has the characteristics of small pixel pitch d3 in the edge region 11b and large pixel pitch d2 in the central region 11a, the edge distortion phenomenon of the display apparatus 10 that occurs during observation can be relieved.

It should be noted that, since the display unit in the display substrate 11 is an OLED display unit, in order to avoid a situation that water and oxygen enter the display unit in the pixel island 112 along the organic light emitting material at the through hole 111 to cause abnormal display, according to some embodiments of the present disclosure as shown in FIG. 5 and FIG. 6, an isolation structure 1131 may be disposed around the through hole 111. The isolation structure 1131 may be located in the bridge portion 113, and used for blocking the organic light emitting material to prevent water and oxygen from entering the display unit in the pixel island 112 along the organic light emitting material at the through hole 111, so as to ensure a display effect of the display substrate 11.

Figure 14:
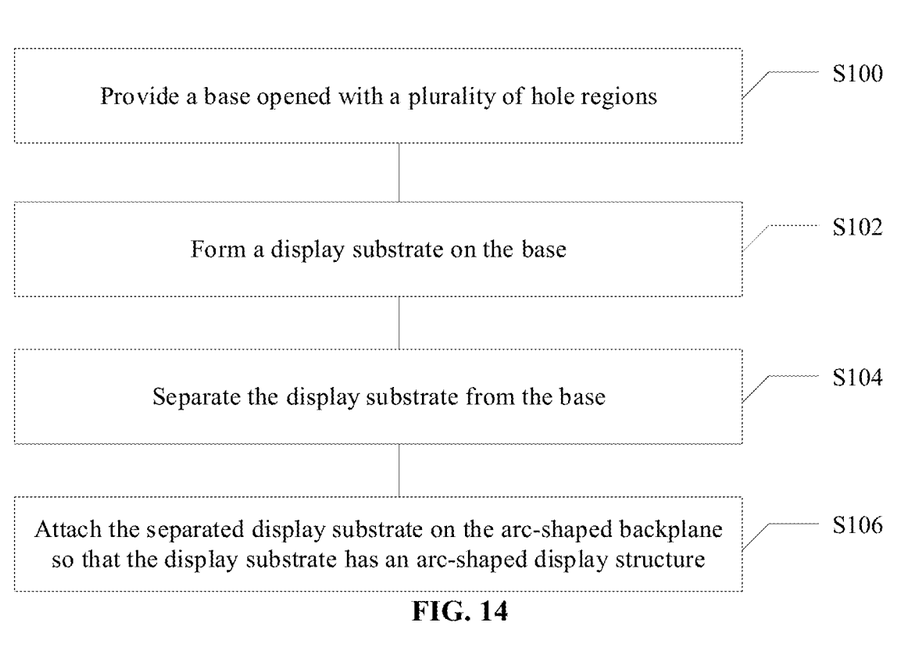
FIG. 14 is a flowchart of a manufacturing method of the display apparatus according to some embodiments of the present disclosure.

The embodiments of the present disclosure also provide a manufacturing method of a display apparatus, which may be an arc-shaped structure with a certain curvature as a whole. As shown in FIG. 14, its manufacturing method may include following steps S100 to S106.

In step S100, a base is provided and opened with a plurality of hole regions.

In step S102, a display substrate is formed on the base, the display substrate is the display substrate 11 according to any embodiment as shown in FIG. 2 to FIG. 6, and the specific structure of the display substrate 11 will not be repeated herein. It should be noted that the through holes 111 of the display substrate 11 correspond to the hole regions of the base one by one.

In step S104, the display substrate is separated from the base.

Figure 8:
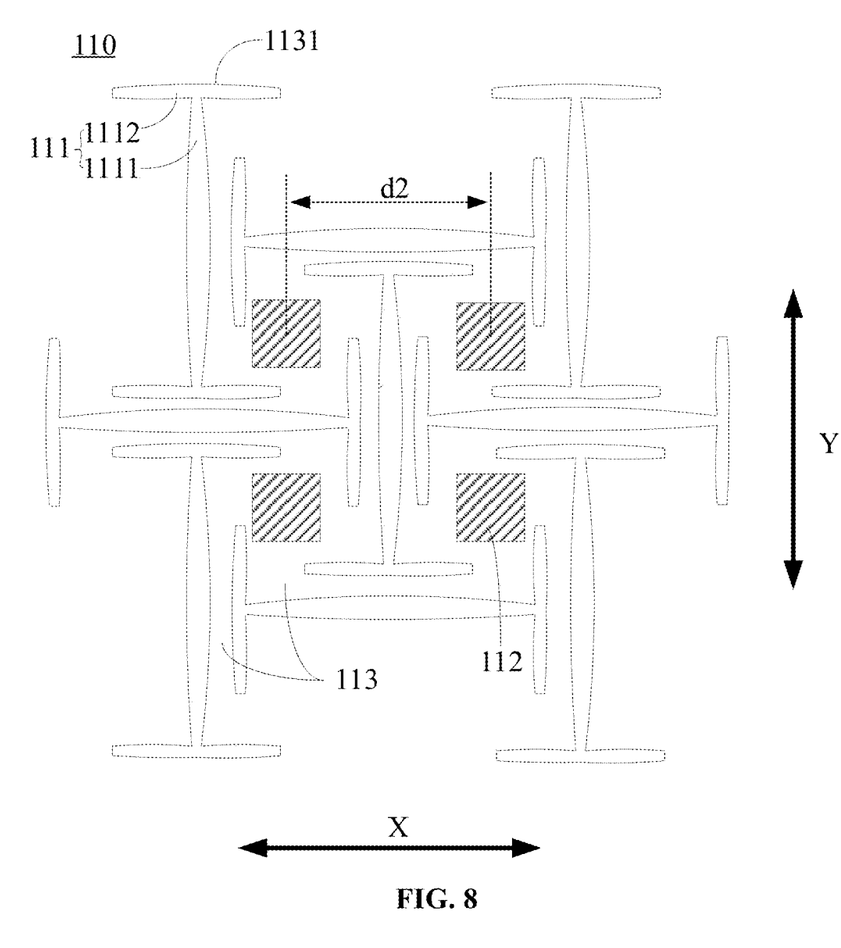
FIG. 8 is a schematic diagram illustrating the positions of various parts in one structural unit in the central region of the display substrate in an arc shape in FIG. 7.
Figure 9:
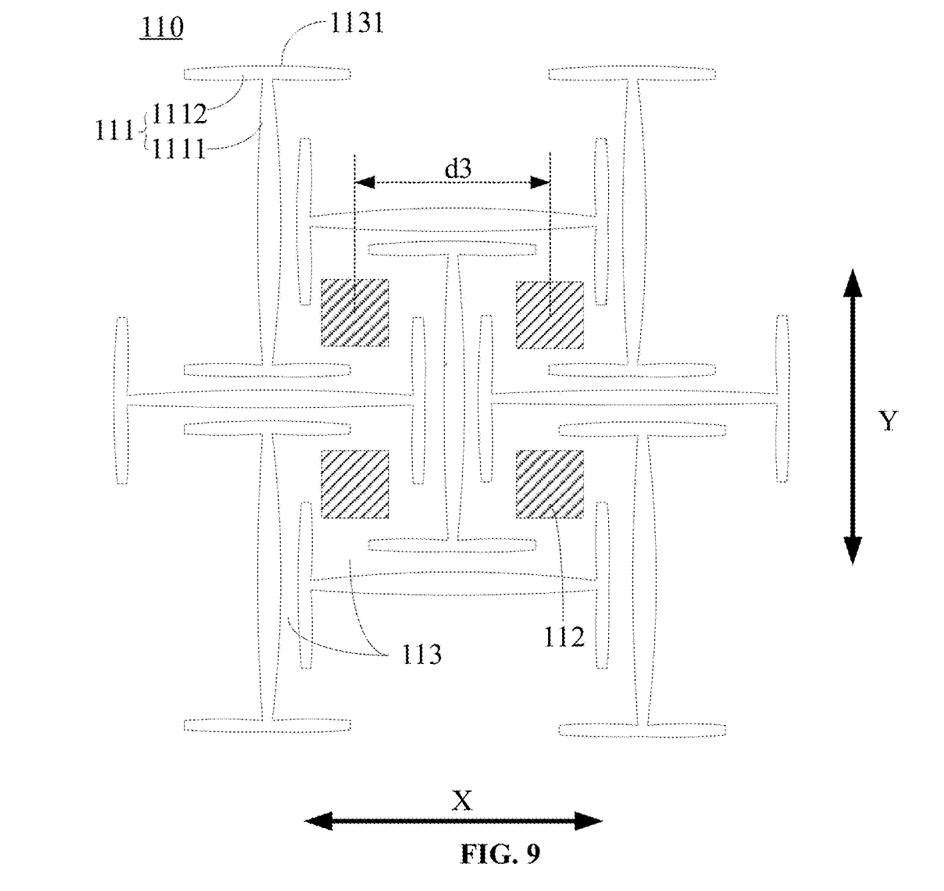
FIG. 9 is a schematic diagram illustrating the positions of various parts in one structural unit in the edge region of the display substrate in an arc shape in FIG. 7.

In step S106, the separated display substrate is attached on the arc-shaped backplane so that the display substrate has an arc-shaped display structure, as shown in FIG. 7 to FIG. 9;

When the display substrate 11 has an arc-shaped display structure, as shown in FIG. 7 to FIG. 12, the pixel pitch of the adjacent pixel islands 112 in the structural unit 110 of its central region 11a is equal to a second pixel pitch d2, and the pixel pitch of the adjacent pixel islands 112 in the structural unit 110 of its edge region 11b is equal to a third pixel pitch d3, the third pixel pitch d3 is greater than the first pixel pitch d1 (as shown in FIG. 3 and FIG. 5) and smaller than the second pixel pitch d2.

In some embodiments, the difference between the second pixel pitch d2 and the first pixel pitch d1 may be 10 μm to 100 μm, such as: 10 μm, 40 μm, 70 μm, 100 μm, and the like.

In step S100, the base is provided and opened with the plurality of hole regions. For example, the base may be a deformable film layer, and the deformable film layer may adopt a structure such as a highly elastic and wrinkled organic film layer, and the organic film layer has a plurality of hole regions; but not limited thereto. The base may also be a rigid base, such as: glass base and the like, depending on the specific circumstances.

In step S102, the display substrate 11 is formed on the base, as shown in FIG. 2 to FIG. 6. For example, a driving circuit and an organic light emitting device may be formed on the non-porous region of the base by deposition, sputtering, evaporation, and the like. The driving circuit may include a thin film transistor, a storage capacitor, signal traces, and the like; the organic light emitting device may include an anode, an organic light emitting material, and a cathode and the like, which are sequentially formed, and the organic light emitting device may be electrically connected to the thin film transistor and the signal traces. The specific structure of the display substrate 11 refers to the structure described in any of the foregoing embodiments, and will not be repeated herein.

In step S104, the display substrate 11 is separated from the base. For example, laser separation, chemical etching separation, physical mechanical separation and the like may be used to separate the display substrate 11 from the base.

In step S106, the separated display substrate 11 is attached to the arc-shaped backplane 12, so that the display substrate 11 has the arc-shaped display structure, as shown in FIG. 7 to FIG. 9. Specifically, the method may include step S1060 and step S1062.

In step S1060, the central region 11a of the separated display substrate 11 is attached to the central region 11a of the arc-shaped backplane 12. For example, the arc-shaped backplane 12 may be a rigid substrate, such as: a glass substrate, etc., but is not limited thereto, and may be other materials.

In step S1062, a roller is rolled from the central region 11a of the display substrate 11 to the edge region 11b of the display substrate 11, so that the edge region 11b of the display substrate 11 is attached with the central region 11a of the arc-shaped backplane 12, thereby forming the arc-shaped display substrate 11.

In some embodiments of the present disclosure, during the process of attaching the display substrate 11 separated from the base to the arc-shaped backplane 12 in the above way, the attaching effect between the display substrate 11 and the arc-shaped backplane 12 can be ensured, and the occurrence of bubbles between the display substrate 11 and the arc-shaped backplane 12 is avoided.

It should be noted that the embodiments of the present disclosure are not limited to the above-mentioned method for attaching the display substrate 11 and the arc-shaped backplane 12, and other methods may also be adopted, depending on the specific circumstances.

It should be noted that although the various steps of the method of the present disclosure are described in a particular order in the drawings, this does not require or imply that the steps must be necessarily performed in that particular order, or that a desired result needs all the steps described to be performed. Additionally or alternatively, certain steps may be omitted, a plurality of steps may be combined into one step to be executed, and/or one step may be divided into a plurality of steps to be executed and the like. Furthermore, some of the above steps can be executed in parallel or sequentially and the like, and are not limited to the specific operation sequence described above.

Figure 10:
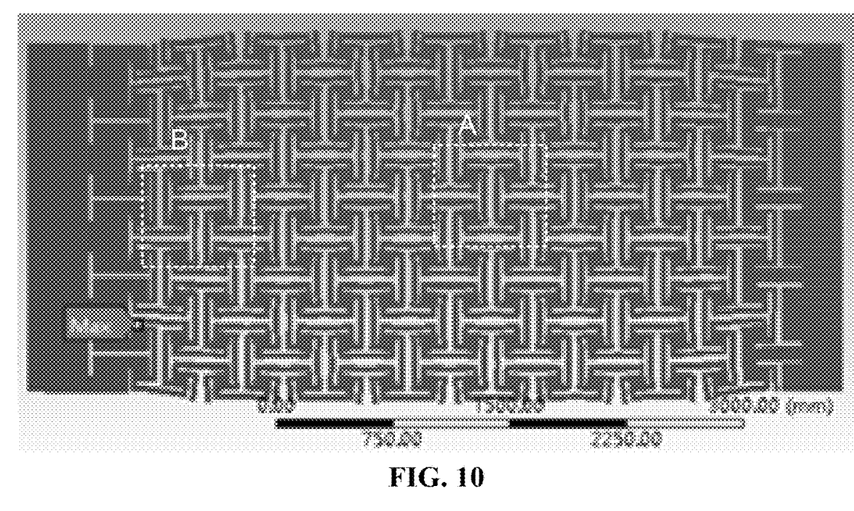
FIG. 10 is a simulation effect diagram of the display substrate in an arc shape according to some embodiments of the present disclosure.

Some embodiments of the present disclosure provide a display apparatus, which may be manufactured by using the manufacturing method described in any one of the above embodiments. As shown in FIG. 7, the display apparatus 10 may include an arc-shaped backplane 12 and an arc-shaped display structure attached on the arc-shaped backplane 12, and the arc-shaped display structure is formed by attaching the display substrate 11 described in any one of the above embodiments with the arc-shaped backplane 12, as shown in FIG. 7 to FIG. 9. The arc-shaped display structure (that is, arc-shaped display substrate 11) includes a plurality of structural units 110 arranged in an array in the central region 11a and the edge region 11b; each structural unit 110 is provided with a plurality of through holes 111, and divided by the plurality of through holes 111 into pixel islands 112 for displaying and bridge portions 113 for transmitting signals. The plurality of through holes 111 are arranged around the pixel islands 112; part of the bridge portion 113 is positioned between the pixel island 112 and the through holes 111, and the other part is positioned between adjacent through holes 111. FIG. 10 illustrates a simulation effect diagram of the display substrate 11 in an arc shape (that is, an arc-shaped display structure) according to some embodiments of the present disclosure. In the arc-shaped display structure, the pixel pitch of the adjacent pixel islands 112 in the structural unit 110 of its central region 11a is equal to the second pixel pitch d2, as shown in FIG. 8, FIG. 10 and FIG. 11; the pixel pitch of the adjacent pixel islands 112 in the structural unit 110 of its edge region 11b is equal to the third pixel pitch d3, as shown in FIG. 9, FIG. 10 and FIG. 12; and the third pixel pitch d3 is smaller than the second pixel pitch d2. It should be understood that, when the display substrate 11 is not attached with the arc-shaped backplane 12, that is, not in its complete state, the first pixel pitch d1 is smaller than the third pixel pitch d3 and the second pixel pitch d2.

In the display apparatus 10 according to some embodiments of the disclosure, because the display substrate 11 in an arc shape attached with the arc-shaped backplane 12 has the characteristics of small pixel pitch d3 in the edge region and large pixel pitch d2 in the central region, the edge distortion phenomenon of the display substrate 11 that occurs during observation can be relieved.

The relationship between the second pixel pitch d2 and the first pixel pitch d1 may specifically refer to the relationship mentioned in the manufacturing method of the display apparatus 10 in the foregoing embodiments, and will not be repeated herein.

In some embodiments, as shown in FIG. 7, the arc-shaped backplane 12 has an inner arc surface 12a close to the arc-shaped display structure and an outer arc surface 12b away from the arc-shaped display structure. The inner arc surface 12a and the outer arc surface 12b have the same shape, and the inner arc surface 12a and the outer arc surface 12b are in one of a circular arc type, an elliptic arc type, or a parabolic shape. Optionally, as shown in FIG. 7, the angle θ between the tangents corresponding to two ends of the outer arc surface 12b in its bending direction is smaller than 180° and greater than or equal to 170°; such as: 170°, 172°, 174°, 176°, 178°, etc.

It should be understood that the overall shape of the arc-shaped display structure formed by the display substrate 11 after being attached to the arc-shaped backplane 12 may be the same as the arc-shaped backplane 12.

In some embodiments, the display apparatus 10 may be a wearable device; for example, the display apparatus 10 may be a head-mounted display apparatus 10, such as: VR glasses and the like, but not limited thereto. The display apparatus 10 may also be any product or component having a display function, such as an OLED display, a mobile device such as a mobile phone and a notebook computer, a wearable device such as a watch, a digital photo frame, a navigator, and the like, and those skilled in the art may select the product or component accordingly according to the specific use of the display apparatus, which will not be described herein.

It should be noted that, the display apparatus 10 includes other necessary parts and components in addition to the arc-shaped backplane 12 and the display substrate 11 in an arc shape (that is, the arc-shaped display structure). Taking a display as an example, necessary parts may include such as a housing, a power line, a driving chip and the like, and those skilled in the art may perform corresponding supplementation according to the specific use requirements of the display apparatus 10, which will not be repeated herein.

After considering the specification and practicing the content disclosed herein, other embodiments of the present disclosure will be apparent to those skilled in the art. The present application is intended to cover any variations, uses, or adaptations of the present disclosure, which follow the general principles of the present disclosure and include common general knowledge or conventional technical means in the art that are not disclosed in the present disclosure. The specification and embodiments are only considered as exemplary, and the true scope and spirit of the present disclosure are pointed out by the claims.

What is claimed is:

1. A display substrate, wherein the display substrate has a central region and an edge region, and the display substrate comprises a plurality of structural units arranged in an array in the central region and the edge region;
   wherein each structural unit is provided with a plurality of through holes, and divided by the plurality of through holes into a pixel island for displaying and a bridge portion for transmitting signals; the plurality of through holes are arranged around the pixel island; a part of the bridge portion is positioned between the pixel island and the through holes, and another part of the bridge portion is positioned between adjacent through holes; and
   wherein a pixel pitch between adjacent pixel islands in the structural units in the edge region is equal to a pixel pitch between adjacent pixel islands in the structural units in the central region, and both are equal to a first pixel pitch,
   wherein the through hole comprises a first long-strip-shaped hole and second long-strip-shaped holes located at opposite ends of the first long-strip-shaped hole, and the first long-strip-shaped hole is communicated with the second long-strip-shaped holes; a length direction of the first long-strip-shaped hole intersects with a length direction of the second long-strip-shaped holes, and a center point of the first long-strip-shaped hole and center points of the second long-strip-shaped holes are on a same straight line; and
   wherein a length of the first long-strip-shaped hole is greater than a length of the second long-strip-shaped holes.

2. The display substrate according to claim 1, wherein a difference between the length of the first long-strip-shaped hole and the length of the second long-strip-shaped holes is 150 μm to 200 μm.

3. The display substrate according to claim 2, wherein the length of the first long-strip-shaped hole is 400 μm to 1000 μm; and the length of the second long-strip-shaped holes is 220 μm to 820 μm.

4. The display substrate according to claim 1, wherein widths of the first long-strip-shaped hole and the second long-strip-shaped holes are equal.

5. The display substrate according to claim 4, wherein the widths of the first long-strip-shaped hole and the second long-strip-shaped holes are 5 μm to 50 μm.

6. The display substrate according to claim 1, wherein the structure unit is provided with four pixel islands arranged in an array in a first direction and a second direction, and each pixel island is surrounded by four through holes; wherein the second direction is a length direction of the first long-strip-shaped holes of two through-holes that are opposite in the first direction, and the first direction is a length direction of the first long-strip-shaped holes of two through-holes that are opposite in the second direction, and the second long-strip-shaped hole of one of any two adjacent through holes is opposite to a middle part of the first long-strip-shaped hole of another one of the any two adjacent through holes.

7. The display substrate according to claim 6, wherein the first pixel pitch is one half of a sum of the length of the first long-strip-shaped hole and the length of the second long-strip-shaped hole.

8. A manufacturing method of the display apparatus, comprising:
   providing a base opened with a plurality of hole regions;
   forming the display substrate according to claim 1 on the base, and the through holes of the display substrate correspond to the hole regions of the base one by one;
   separating the display substrate from the base;
   attaching the separated display substrate on an arc-shaped backplane to form an arc-shaped display structure;
   wherein in the arc-shaped display structure, a pixel pitch between adjacent pixel islands in the structural unit of the central region is equal to a second pixel pitch, and a pixel pitch between adjacent pixel islands in the structural unit of the edge region is equal to a third pixel pitch, and the third pixel pitch is greater than the first pixel pitch and smaller than the second pixel pitch.

9. The manufacturing method according to claim 8, wherein a difference between the second pixel pitch and the first pixel pitch is 10 μm to 100 μm.

10. The manufacturing method according to claim 9, wherein separating the display substrate from the base comprises:
    separating the display substrate from the base by means of laser separation, or chemical etching separation, or physical mechanical separation.

11. The manufacturing method according to claim 9, wherein attaching the separated display substrate on the arc-shaped backplane comprises:
    attaching the central region of the separated display substrate to a central region of the arc-shaped backplane; and
    rolling a roller from the central region of the display substrate to the edge region of the display substrate, causing the edge region of the display substrate to be attached with an edge region of the arc-shaped backplane.

12. A display apparatus, comprising an arc-shaped display structure, wherein the arc-shaped display structure is formed by attaching the display substrate according to claim 1 with an arc-shaped backplane;
    wherein in the arc-shaped display structure, a pixel pitch between adjacent pixel islands in the structural unit of the central region is equal to a second pixel pitch, and a pixel pitch between adjacent pixel islands in the structural unit of the edge region is equal to a third pixel pitch, and the third pixel pitch is greater than the first pixel pitch and smaller than the second pixel pitch.

13. The display apparatus according to claim 12, wherein a difference between the second pixel pitch and the first pixel pitch is 10 μm to 100 μm.

14. The display apparatus according to claim 12, wherein the arc-shaped backplane comprises an inner arc surface close to the arc-shaped display structure and an outer arc surface away from the arc-shaped display structure, the inner arc surface and the outer arc surface have a same shape, and the inner arc surface and the outer arc surface are in one of a circular arc type, an elliptic arc type, or a parabolic shape.

15. The display apparatus according to claim 14, wherein an angle between tangents corresponding to two ends of the outer arc surface in a bending direction is smaller than 180° and greater than or equal to 170°.

16. The display apparatus according to claim 12, wherein the display apparatus is a head-mounted display apparatus.

17. The display substrate according to claim 2, wherein the structure unit is provided with four pixel islands arranged in an array in a first direction and a second direction, and each pixel island is surrounded by four through holes;

wherein the second direction is a length direction of the first long-strip-shaped holes of two through-holes that are opposite in the first direction, and the first direction is a length direction of the first long-strip-shaped holes of two through-holes that are opposite in the second direction, and the second long-strip-shaped hole of one of any two adjacent through holes is opposite to a middle part of the first long-strip-shaped hole of another one of the any two adjacent through holes.

18. The display substrate according to claim 5, wherein the structure unit is provided with four pixel islands arranged in an array in a first direction and a second direction, and each pixel island is surrounded by four through holes;

wherein the second direction is a length direction of the first long-strip-shaped holes of two through-holes that are opposite in the first direction, and the first direction is a length direction of the first long-strip-shaped holes of two through-holes that are opposite in the second direction, and the second long-strip-shaped hole of one of any two adjacent through holes is opposite to a middle part of the first long-strip-shaped hole of another one of the any two adjacent through holes.

19. The display substrate according to claim 18, wherein the first pixel pitch is one half of a sum of the length of the first long-strip-shaped hole and the length of the second long-strip-shaped hole.

* * * * *